(12) United States Patent
Fukuzawa et al.

(10) Patent No.: US 6,242,160 B1
(45) Date of Patent: *Jun. 5, 2001

(54) PATTERNING METHOD OF CHEMICAL AMPLIFICATION TYPE RESIST FILM FOR FAR ULTRAVIOLET RADIATION

(75) Inventors: Shinichi Fukuzawa; Kunihiko Kasama, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/883,751

(22) Filed: Jun. 27, 1997

(30) Foreign Application Priority Data

Jun. 27, 1996 (JP) .................................................. 8-167759

(51) Int. Cl.$^7$ ........................................................ G03F 7/20
(52) U.S. Cl. ............................ 430/313; 430/395; 430/950
(58) Field of Search ................................. 430/395, 950, 430/330, 325, 311, 313, 322

(56) References Cited

U.S. PATENT DOCUMENTS 5,851,738 * 12/1998 Thackeray et al. ................... 430/327

FOREIGN PATENT DOCUMENTS

| 59-6540 | 1/1984 | (JP) . |
| 62-46529 | 2/1987 | (JP) . |
| 1-241125 | 9/1989 | (JP) . |

* cited by examiner

Primary Examiner—Kathleen Duda

(57) ABSTRACT

KrF excimer laser beam is selectively irradiated to a resist film. At this time, an incident light (KrF excimer laser beam) is reflected at the surface of an antireflection film to be a first reflected light, and is reflected at the surface of a film to be patterned to be a second reflected light. A standing wave is obtained by interference between the incident light and the first and the second reflected light. A light intensity of this standing wave has extreme maximum and extreme minimum appearing alternately, and a pair of extreme minimum and extreme maximum is across the first interface. A reflection index of the first reflected light is a range of 10 to 20%. Also, the thickness of the antireflection film is adjusted so that the extreme maximum of the pair is located in the resist film and the extreme minimum of the pair is located in the antireflection film.

17 Claims, 8 Drawing Sheets

PATTERNING METHOD OF CHEMICAL AMPLIFICATION TYPE RESIST FILM FOR FAR ULTRAVIOLET RADIATION

BACKGROUND OF THE INVENTION

1. Field of the Invention

The present invention relates generally to a patterning method of a chemical amplification type resist film. More specifically, the invention relates to a patterning method of a chemical amplification type resist film for a far ultraviolet radiation, to be formed on an antireflection film.

2. Description of the Prior Art

In a lithographic process as one of a fabrication process of a semiconductor element, at first, a silicon oxide film, a BPSG film, a silicon nitride film, a polycrystalline silicon film, various silicide film, a metal film such as an aluminum or an aluminum alloy film and the like, are formed on a silicon substrate. Next, a resist film is applied on the film. The resist film is exposed in a desired pattern, and then developed. Subsequently, the film which should be patterned is etched with taking the resist film patterned into the desired pattern as a mask.

In such lithographic process, if the film to be patterned is the polycrystalline silicon film, the silicide film, the metal film such as aluminum or aluminum alloy film and the like, reflection of a light at an interface between the resist film and the film to be patterned becomes large. Accordingly, the shape of the pattern of the resist film after development is significantly degraded by reflection of the light. Therefore, in the prior art, in order to reduce reflection index at the interface between the film to be patterned and the resist film, various methods for forming an antireflection films between the resist film and the film to be patterned have been proposed (see Japanese Unexamined Patent Publications (Kokai) Nos. Showa 59-6540, Showa 62-46529 and Heisei 1-241125).

Hereinafter, a fabrication process of the semiconductor device disclosed in Japanese Unexamined Patent Publication No. Showa 59-6540 will be referred to as "first prior art", an etching method of the film to be patterned disclosed in Japanese Unexamined Patent Publication No. Showa 62-46529 will be referred to as "second prior art", and a fabrication process of the semiconductor device disclosed in Japanese Unexamined Patent Publication No. Heisei 1-241125 will be referred to as "third prior art".

FIG. 1 is a section showing the fabrication process of the semiconductor device in the first prior art. An oxide layer 202a is formed on the surface of a semiconductor substrate 201a. A metal film (film to be patterned) 213 of 0.2 to 1 μm thick, is formed on the surface of the oxide layer 202a. Next, a layer semi-permeable to a light to be used in lithography, such as an antireflection film 221a of silicon nitride, for example, is grown on the surface of the metal film 213 by way of plasma excited vapor deposition (PECVD) method. Then, a resist film 231a is formed on the surface of the antireflection film 221a.

Subsequently, above these, a photo-mask 261 formed with a desired pattern of light shielding layer 262, is arranged. Next, a light beam 241 is irradiated on the resist film 231a from the upper side of the photo mask 261. Then, the resist film 231a is exposed by a light 241 past through the photo mask 261 in the region where the light shielding layer 262 is not formed.

At this time, a part of the light inciding in the resist film 231a is reflected at the surface of the antireflection film 221a. The remaining light therefore which passes through the antireflection film 221a is reflected at the surface of the metal film 213, and then discharged from the surface of the antireflection film 221a. In the first prior art, the antireflection film 221a is selected so that an intensity of discharged light (reflected light) becomes less than or equal to 30% relative to an intensity of an incident light. Thus, photosensitivity of the discharged light relative to the resist film 213 can be lowered to be ignorably low. Accordingly, by the antireflection film 221a, degradation of pattern of the resist film by the reflected light by the metal film 213 can be successfully prevented.

FIG. 2 is a section showing an etching method of the film to be patterned in the second prior art. At first, an oxide layer 202b and a polycrystalline silicon layer (film to be patterned) 214 are sequentially formed on the surface of the silicon substrate 201b. Next, an antireflection film 221b of silicon nitride is formed on the surface of the polycrystalline silicon layer. Then, a resist film 231b is deposit on the surface of the antireflection film 221b. Thereafter, the resist film 231b is selectively exposed by irradiating a light on the resist film 231b in the desired pattern.

In the second prior art, the material of the antireflection film is selected so that a refractive index n of the light in the antireflection film 221b becomes greater than a refractive index n, of the light in the resist film 231b and smaller than a refractive index $n_2$ of the light in the antireflection film 221b. The refractive index of the light is defined as, the reflected light by the antireflection film 221b and the polycrystalline silicon layer 214 is interfered by incident light to the antireflection film 221b. Thus, amplitude of the discharged light can be made smaller. Accordingly, similarly to the first prior art, degradation of the pattern shape of the resist film 231b by the reflected light by the polycrystalline silicon layer 214, can be successfully prevented.

FIG. 3 is a section showing a fabrication process of the semiconductor device in the third prior art. At first, a field oxide layer 203 is selectively formed on the surface of a silicon substrate 201c. Then, a gate oxide layer 204 is formed on the surface of an element region defined by the field oxide layer 203. Subsequently, on these surfaces, an undercoat layer (film to be patterned) 215 of tungsten silicide is formed. Then, an antireflection film 221c of silicon nitride is formed on the surface of the undercoat layer 215. A resist film 231c is formed on the surface of the antireflection film 221c. Subsequently, similarly to the foregoing first and second prior arts, the resist film 231c is exposed by irradiating light on the resist film 231c in the desired shape.

In the third prior art, material of the undercoat layer 215 and the antireflection film 221c and thickness of the antireflection film 221c and so forth are selected so that an incident light to the antireflection film 221c and a reflected light from the antireflection film 221c and from the undercoat layer 215 cause interference to make the effective reflection index of the undercoat layer minimum. Accordingly, it can be successfully prevent degradation of the pattern shape of the resist film 231c by the reflected light.

On the other hand, the first to third prior art as set forth above, are directed to form a novolac type resist film to be used for a light (g ray) having a wavelength of 436 nm or a light (i ray) having a wavelength of 365 nm. This novolac type resist film shows color degradation property (bleaching characteristics).

However, a chemical amplification type resist film to be used for exposure by far ultraviolet radiation (KrF excimer laser or ArF excimer laser) having wavelength of 248 nm or 193 nm, in either positive type or negative type, generally does not have color degradation property. When the chemical amplification type resist film for far ultraviolet radiation is used, if a reflection index of the light at the interface between the resist film and the antireflection film is too low, degradation may be caused on the sectional configuration of the patterned resist film. Namely, if the resist film is the positive type, the sectional configuration of the patterned resist film becomes a tapered form or have non-uniformly spread baseboard portion. On the other hand, if the resist film is the negative type, the sectional configuration of the patterned resist film becomes a reversed taper form or is formed into a shape having non-uniform cut-outs from the surface of the baseboard portion toward inside.

Accordingly, when the chemical amplification type resist film for far ultraviolet radiation is employed, even if the reflection index of the light at the interface between the resist film and the antireflection film is made small, the patterned resist film with satisfactory sectional configuration cannot be formed. It should be noted that the satisfactory sectional configuration means that the wall surface of the patterned resist film lies perpendicularly to the substrate.

When the first to third prior art set forth above is applied for the chemical amplification type resist film for the far ultraviolet radiation, the following problems should be encountered. FIG. 4A is a section showing a shape of the chemical amplification type resist film for the far ultraviolet radiation after development, and FIG. 4B is a plan view thereof. As shown in FIGS. 4A and 4B, an insulation layer 202d is formed on the surface of the silicon substrate 201d. An undercoat layer 216 as a film to be patterned is formed on the surface of the insulation layer 202d. Also, an antireflection film 221d of silicon nitride is formed on the surface of the undercoat layer 216. A positive chemical amplification type resist film (not shown) for far ultraviolet radiation is formed on the surface of the antireflection film 221d. After exposure of this resist film, it is developed to form the patterned resist film 233.

As shown in FIGS. 4A and 4B, when the chemical amplification type resist film for far ultraviolet radiation is formed on the surface of the antireflection film 221d of silicon nitride and is developed, if the condition is not appropriately selected, the baseboard portion of the patterned resist film 233 may non-uniformly spread. Accordingly, the shape of the baseboard portion 235 on the interface 251 between the patterned resist film 233 and the antireflection film 221d cannot become straight. Namely, a pattern width 236 defined by the shape of the baseboard portion 235 of the patterned resist film 233 cannot be a constant value.

As a result, even when the undercoat layer 216 is patterned with employing the patterned resist film 233 as an etching mask, the undercoat layer 216 cannot be removed in the desired width by etching. Thus, characteristics of the semiconductor device may be degraded.

SUMMARY OF THE INVENTION

It is an object of the present invention to provide a patterning method for a chemical amplification type resist film for far ultraviolet radiation, which can pattern the chemical amplification type resist film in good shape and whereby can restrict degradation of the characteristics of a semiconductor device.

A patterning method of a chemical amplification type resist film for a far ultraviolet radiation, according to the present invention, includes a step of forming an antireflection film on a film to be patterned which is formed on a semiconductor substrate. Then, a chemical amplification type resist film for far ultraviolet radiation is formed on the antireflection film. A first interface is formed between the antireflection film and the resist film. And a second interface is formed between the antireflection film and the film to be patterned. Subsequently, a light for lithography is irradiated selectively to the resist film. In this step, the light incides to the resist film as an incident light and is reflected at the first interface to be a first reflected light. This first reflected light has a light intensity in a range of 10 to 20% of the light intensity of the incident light. Also, the incident light is reflected at the second interface to be a second reflected light. The first and second reflected light are combined to form a composite reflected light to cause interference with the incident light. By this, a standing wave is formed. A light intensity of the standing wave has extreme maximum and extreme minimum appearing alternately, a pair of extreme minimum and extreme maximum being across the first interface. The extreme minimum of the pair is located in the antireflection film. And the extreme maximum of the pair is located in the resist film.

The light intensity of the first reflected light and the light intensity of the standing wave may be set by adjusting a thickness of the antireflection film.

The antireflection film may be a film selected among a group consisted of silicon nitride film, silicon nitride oxide film, silicon carbide film, hydrogen added amorphous carbon (amorphous-C:H) film and organic film.

An insulation layer may be formed between the semiconductor substrate and the film to be patterned.

Also, the film to be patterned may be a film selected among a group consisted of polycrystalline silicon film, silicide film and metal film. Also, the light for lithography may be a light selected among a group consisted of KrF excimer laser beam, ArF excimer laser beam, g ray and i ray.

The patterning method of a chemical amplification type resist film may further includes the steps of performing post-exposure-bake for the resist film after irradiating the light for lithography to the resist film and developing baked resist film.

It is preferred that the antireflection film is silicon nitride film having a thickness in a range of 0.03 to 0.04 $\mu$m. However, in the present invention, the thickness out of the foregoing thickness range may be permissible. In this case, the step of forming the antireflection film may be a step of forming silicon nitride film using a mixture gas of monosilane gas and ammonia gas, in which monosilane gas has 20% of volume ratio versus the ammonia gas, at a pressure of 40 Pa, temperature of 300° C., with employing 400W of radio frequency power.

The semiconductor substrate may be a silicon substrate or a compound semiconductor substrate.

In the present invention, the thickness of the antireflection film is adjusted so that desired light intensity ratio and desired standing wave are obtained. Thus, the side surface of the obtained patterned resist film extends substantially perpendicular to the substrate. Accordingly, the baseboard portion of the patterned resist film in good shape can be obtained. Therefore, when the obtained patterned resist film is used as a mask, the film to be patterned can be patterned in good shape. Thus, degradation of the semiconductor characteristics can be successfully avoided.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 1:
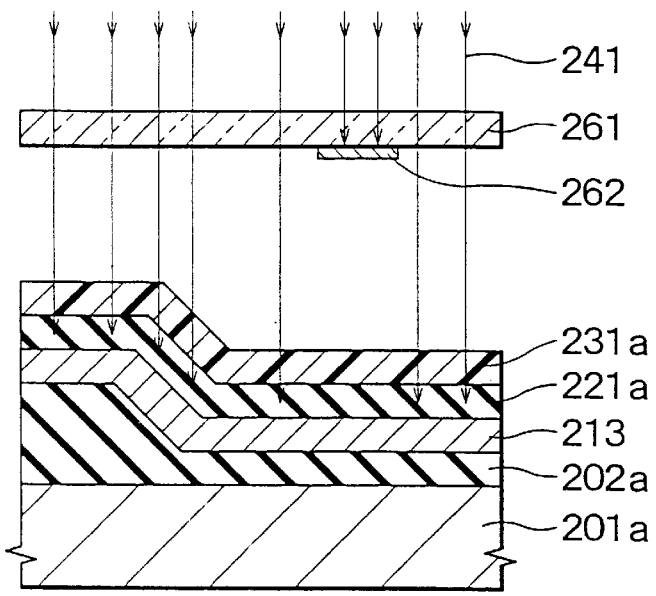
FIG. 1 is a section showing a fabrication process of the semiconductor device in the first prior art.
Figure 2:
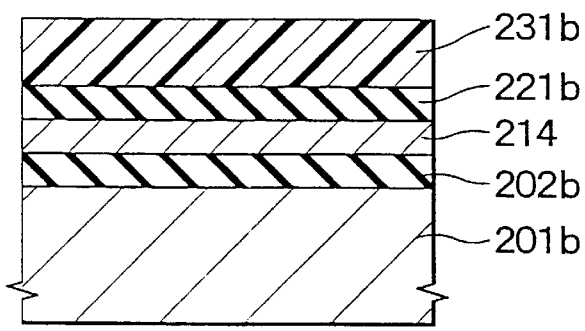
FIG. 2 is a section showing an etching method of a film to be patterned in the second prior art.
Figure 3:
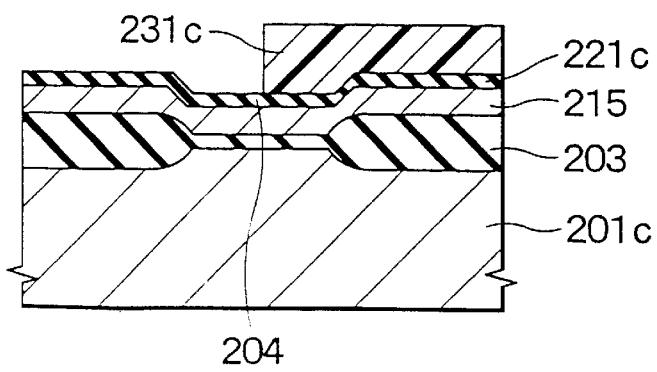
FIG. 3 is a section showing a fabrication process of the semiconductor device in the third prior art.
Figure 4A:
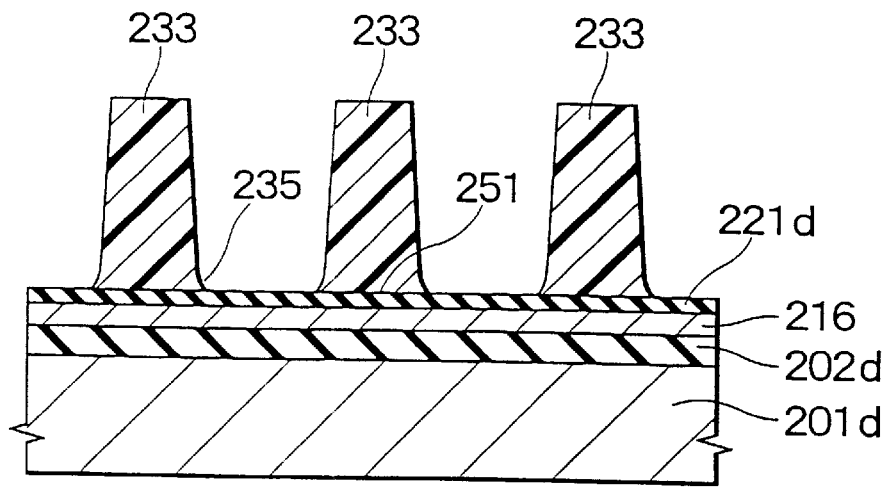
FIGS. 4A is a section showing a shape of a chemical amplification type resist film for a far ultraviolet radiation after development.
Figure 4B:
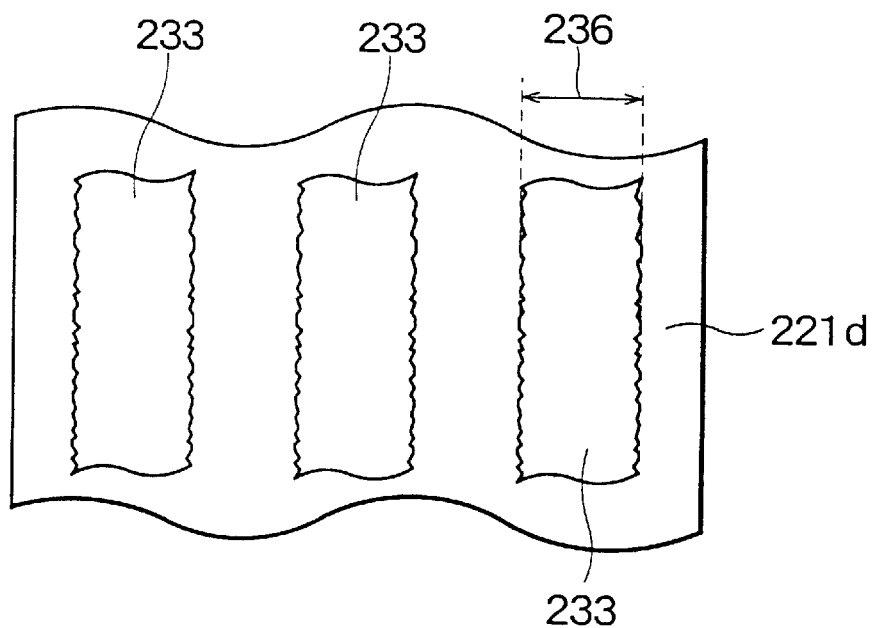
FIG. 4B is a plan view of the chemical amplification type resist film of FIG. 4A.
Figure 5A:
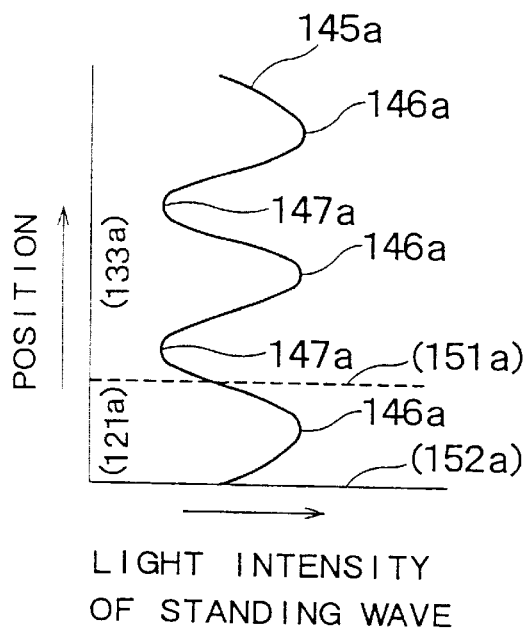
FIG. 5A is a graph showing a light intensity distribution at respective positions with taking the position in vertical axis and the light intensity of a standing wave in horizontal axis.
Figure 5B:
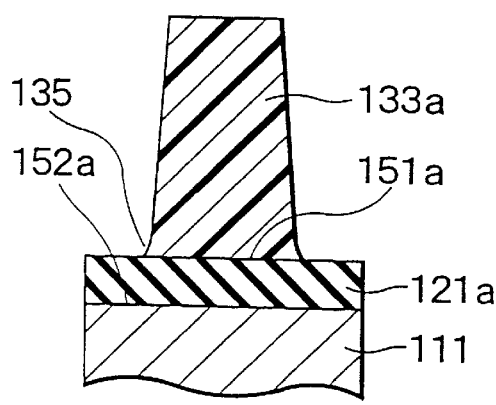
FIG. 5B is a section showing a forming method of the positive chemical amplification type resist film.
Figure 6A:
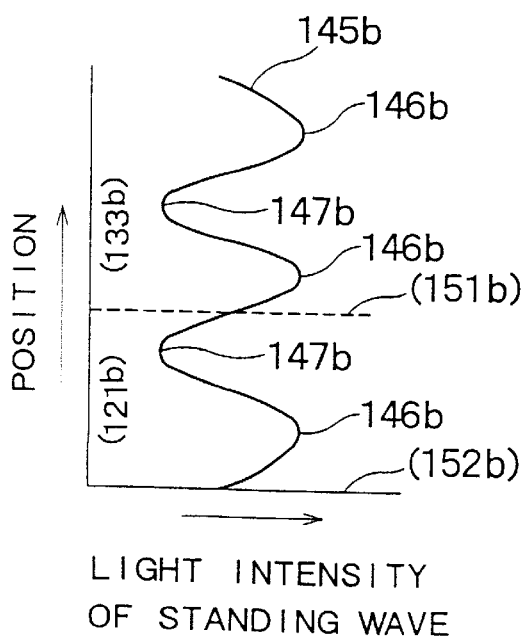
FIG. 6A is a graph showing a light intensity distribution at respective positions with taking the position in vertical axis and the light intensity of a standing wave in horizontal axis.
Figure 6B:
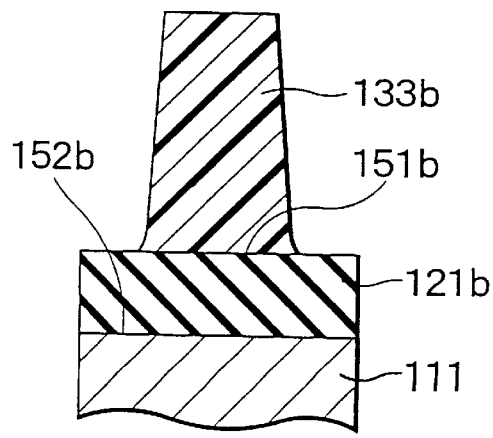
FIG. 6B is a section showing a forming method of the positive chemical amplification type resist film.

FIG. 5A is a graph showing a light intensity distribution at respective positions with taking the position in vertical axis and the light intensity of a standing wave in horizontal axis, and FIG. 5B is a section showing a forming method of the positive chemical amplification type resist film. Similarly, FIG. 6A is a graph showing a light intensity distribution at respective positions with taking the position in vertical axis and the light intensity of a standing wave in horizontal axis, FIG. 6B is a section showing a forming method of the positive chemical amplification type resist film. It should be noted that an antireflection film 121a shown in FIG. 5B and an antireflection film 121b shown in FIG. 6B have mutually different thickness.

In a formation process of a resist film shown in FIG. 5B, at first, an insulation layer (not shown) and a film 111 to be patterned of a tungsten silicide are formed on the surface of a silicon substrate (not shown), in sequential order. Next, an antireflection film 121a of silicon nitride is formed on the surface of the film 111 to be patterned. Next, a positive chemical amplification type resist film (not shown) is formed on the surface of the antireflection film 121a.

Subsequently, a light used for lithography is irradiated on the resist film from the above, the resist film is selectively exposed. It should be noted that a part of light is reflected at a first interface 151a between the resist film and the antireflection film 121a. On the other hand, the remaining light penetrates inside of the antireflection film 121a and is reflected at a second interface 152a between the antireflection film 121a and a film 111 to be patterned, and then again discharged from the surface of the antireflection film 121a. Subsequently, the resist film is subject to post-exposure-bake (PEB) and then developed to be formed into a patterned resist film 133a.

Thus, in a process step of irradiating light on the resist film, due to interference between an incident light to the antireflection film 121a and a reflected light from the first interface 151a and the second interface 152a, a standing wave 145a is generated in the resist film and the antireflection film 121a, as shown in FIG. 5A. A light intensity of the standing wave has extreme maximum 146a and extreme minimum 147a appearing alternately in a thickness direction of these layers. And a pair of extreme maximum 146a and extreme minimum 147a is across the first interface 151a. In the construction shown in FIG. 5B, the thickness of the antireflection film 121a is set in a range of a first thickness. The range of the first thickness is the range of thickness where the extreme maximum 146a of the pair of the light intensity of the standing wave 145a is located in the side of the antireflection film 121a and the extreme minimum 147a of the pair of the light intensity of the standing wave 145a is located in the side of the resist film.

On the other hand, in the formation process of the resist film shown in FIG. 6B, at first, an insulation layer (not shown) and a film 111 to be patterned of tungsten silicide are formed on the surface of a silicon substrate (not shown), in sequential order. Next, an antireflection film 121b of silicon nitride is formed on the surface of the film 111 to be patterned. Next, a positive chemical amplification type resist film (not shown) is formed on the surface of the antireflection film 121b.

Subsequently, a light used for lithography is irradiated on the resist film from the above, the resist film is exposed. It should be noted that a part of light is reflected at a first interface 151b between the resist film and the antireflection film 121b. On the other hand, a remained light penetrates inside of the antireflection film 121b and is reflected at a second interface 152b between the antireflection film 121b and a film 111 to be patterned, and then again discharged from the surface of the antireflection film 121b. Subsequently, the resist film is subject to PEB and then developed to be formed into a patterned resist film 133b.

In a process step of irradiating light on the resist film shown in FIG. 6B, due to interference between an incident light to the antireflection film 121b and a reflected light from the first interface 151b and the second interface 152b, a standing wave 145b is generated in the resist film and the antireflection film 121b, as shown in FIG. 6A. A light intensity of the standing wave 145b has extreme maximum 146b and extreme minimum 147b appearing alternately in a thickness direction of these layers And a pair of extreme maximum 146b and extreme minimum 147b is across the first interface 151b.

In the construction shown in FIG. 6B, the thickness of the antireflection film 121b is set in a range of a second thickness. The range of the second thickness is the range of thickness where the extreme maximum 146b of the pair of the light intensity of the standing wave 145b is located in the side of the resist film and the extreme minimum 147b of the pair of the light intensity of the standing wave 145b is located in the side of the antireflection film 121b. It should be noted that the films to be patterned shown in FIGS. 5B and 6B have flat surfaces.

In the chemical amplification type resist film, acid is generated by exposure. The concentration of the acid depends on intensity of light to be used for exposure of the resist film. Then, acid catalytic reaction is caused for the exposed portion of the resist film by performing PEB. When the positive type resist film is used, the exposed portion of the resist film becomes soluble to a developing fluid by the acid catalytic reaction. It should be noted that, diffusion of acid is caused by performing PEB, to slightly restrict distribution of the acid concentration at various position in the resist film, and namely distribution of concentration of acid catalytic reaction amount.

As shown in FIGS. 5A and 5B, when the thickness of the antireflection film 121a is defined to be in the first thickness range, the acid concentration in the resist film becomes low in the vicinity of the first interface 151a. Therefore, the baseboard portion 135 of the patterned resist film 133a is spread in non-uniform fashion. Namely, the shape of the baseboard portion 135 on the first interface 151a between the patterned resist film 133a and the antireflection film 121a becomes not straight.

On the other hand, as shown in FIG. 6A and 6B, when the thickness of the antireflection film 121b is defined to be within the second thickness range, acid concentration in the resist film becomes high in the vicinity of the first interface 121b. Therefore, the patterned resist film 133b may have the shape having a side surface substantially perpendicular to the substrate.

When the chemical amplification type resist film for far ultraviolet radiation is used as the resist film, even if the reflection index of the light is simply defined, the patterned resist film having good sectional configuration cannot be formed. Accordingly, in the present invention, the thickness of the antireflection film is defined so that the extreme maximum of the pair across the first interface is located in the side of resist film and the extreme minimum of the pair is located in the side of the antireflection film, as shown in FIG. 6A.

Figure 7:
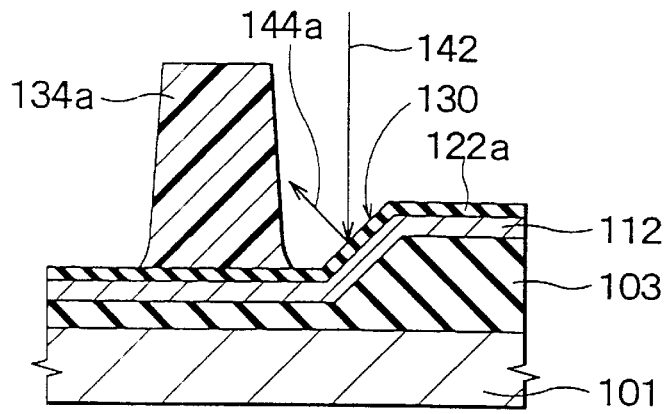
FIGS. 7 to 9 are sections showing example of shapes of patterned resist film when the resist film is formed on the film to be patterned having a tilted portion on the surface.
Figure 8:
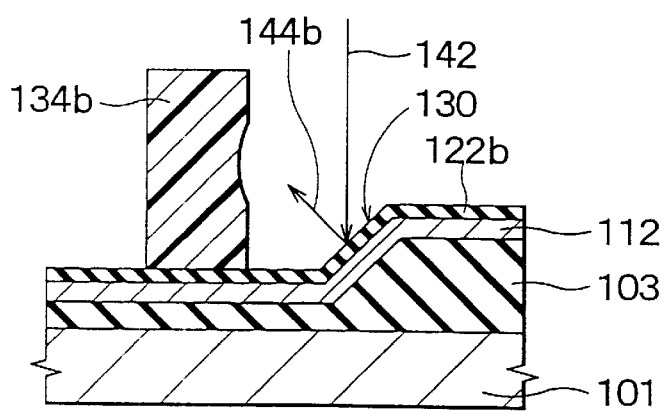
Figure 9:
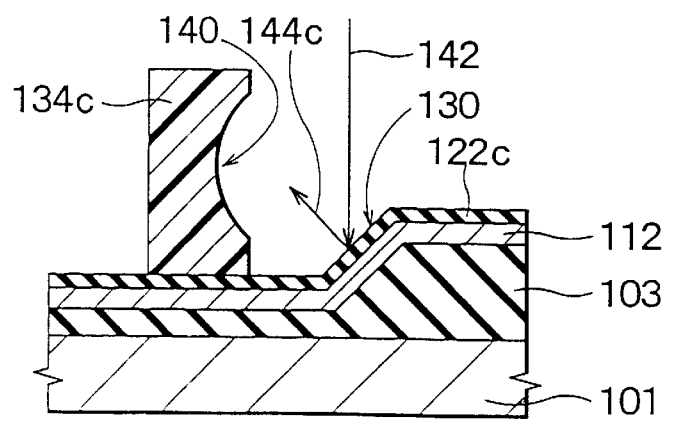

Next, discussion will be given for the case where the surfaces of the film to be patterned and a layer under the film to be patterned are not flat. FIGS. 7 to 9 are sections showing example of shapes of the patterned resist films when the resist film is formed on the film to be patterned having a tilted portion 130 on the surface. As shown in FIGS. 7 to 9, the insulation layer 103 is formed on the silicon substrate 101. The insulation layer 103 has different thickness at different regions. Therefore, a tilted portion 130 is formed on the surface. The film 112 to be patterned of tungsten silicide is formed on the surface of the insulation layer 103.

Furthermore, antireflection films 122a, 122b or 122c are formed on the surface of the film 112 to be patterned. It should be noted that the thickness of these antireflection films are set within the second thickness range.

When the pattern resist film is formed on the surface of the antireflection film constructed as set forth above, at first, the resist film (not shown) is formed on the surface of the antireflection film. Next, the region of the resist film, where the light is irradiated, is exposed by irradiating the light 142 for lithography from the upper side of the resist film. After performing PEB for the exposed resist film, development is performed to form the patterned resist film 134a, 134b or 134c.

FIGS. 7 to 9 show the patterned resist films having varies reflection index of the light 142 at the interface between the resist film and the antireflection films 122a, 122b or 122c. A reflection index of the light 142 at the antireflection film 122a shown in FIG. 7 is 5%, a reflection index of the light 142 at the antireflection film 122b shown in FIG. 8 is 15%, and a reflection index of the light 142 at the antireflection film 122c shown in FIG. 9 is 30%. When the light 142 is irradiated on the tilted portion 130, if the reflection index of the light 142 at the interface between the resist film and the antireflection film in the tilted portion 130 is not appropriately defined, the reflected lights 144a, 144b, 144c should irradiate the portion not the exposure region of the resist film. As a result, the shape of the patterned resist films 134a, 134b or 134c may be degraded.

As shown in FIG. 7, when the reflection index of the light at the surface of the antireflection film 122a is less than 10%, little degradation of shape of the patterned resist film 134a should be caused by the reflected light 144a from the tilted portion 130. In this case, since the thickness of the antireflection film 122a is appropriately defined, the baseboard portion of the patterned resist film 134a will not become non-uniform. However, the sectional shape becomes tapered form, in which the baseboard portion is uniformly spread. Accordingly, by performing patterning the film 112 to be patterned using this patterned resist film 134a as a mask, the width of the obtained layer (wiring) becomes greater than a desired width.

As shown in FIG. 8, when the reflection index of the light at the surface of the antireflection film 122b is in a range of 10 to 20%, slight degradation of shape of the patterned resist film 134b should be caused by the reflected light 144b from the tilted portion 130. However, this degradation does not have a bad effect on the patterning of the film 112 to be patterned. Also, since the thickness of the antireflection film 122b is appropriately defined, the baseboard portion of the patterned resist film 134b will not become non-uniform. The sectional shape of the patterned resist film have the side surface substantially perpendicular to the substrate. Accordingly, by performing patterning the film 112 to be patterned using this patterned resist film 134b as a mask, the width of the obtained layer (wiring) becomes substantially the desired width.

As shown in FIG. 9, when the reflection index of the light at the surface of the antireflection film 122c is in excess of 20%, significant degradation of shape of the patterned resist film 134c should be caused by the reflected light 144c from the tilted portion 130. Namely, while the sectional shape of the patterned resist film have the side surface substantially perpendicular to the substrate, partially recessed portion 140 may be formed. Accordingly, by performing patterning the film 112 to be patterned using this patterned resist film 134c as a mask, while the width of the obtained layer (wiring) becomes substantially the desired width. However, it is possible to form a portion where the width becomes smaller than the desired width.

As set forth above, in the present invention, when the chemical amplification resist film for the far ultraviolet radiation is formed on the surface of the antireflection film, the antireflection film is selected so that the reflection index of the light at the interface between the resist film and the antireflection film falls within a range of 10 to 20%. On the other hand, as set forth above, the thickness of the antireflection film is defined so that, the extreme maximum of the pair across the first interface is located in the side of the resist film and the extreme minimum of the pair is located in the side of the antireflection film. By this, the resist film can be patterned into the desired cross sectional configuration.

Figure 10:
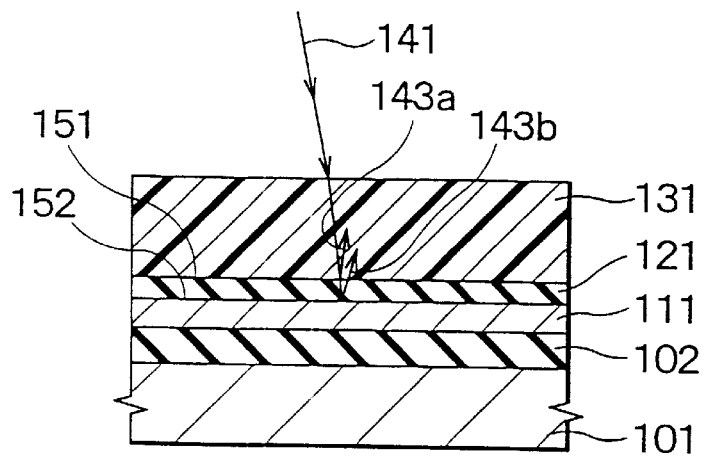
FIG. 10 is a section showing the preferred embodiment of a patterning method of a resist film according to the present invention.

Next, discussion will be given for the preferred embodiment of the patterning method of the resist film according to the present invention. FIG. 10 is a section showing the preferred embodiment of the patterning method of the resist film according to the present invention. As shown in FIG. 10, at first, an insulation layer 102 is formed on the surface of a silicon substrate 101. A film 111 to be patterned of tungsten silicide is formed in a thickness of about 0.1 $\mu$m on the surface of the insulation layer 102, by way of sputtering. The complex refraction index $n_w$ of the film 111 to be patterned is expressed by $n_w$=2.40–3.14 i. Next, a silicon nitride film 121 as the antireflection film is formed on the surface of the film 111 to be patterned by PECVD. The complex refraction index $n_N$ of the silicon nitride film 121 is expressed by $n_N$=2.55–0.40 i. Next, a positive chemical amplification type resist film 131 for the far ultraviolet radiation is formed in a thickness of 0.7 to 0.8 $\mu$m on the surface of the silicon nitride film 121. It should be noted that permeability of the resist film 131 is 60 to 70%, and the complex refraction index $n_R$ is expressed by $n_R$=2.55–0.018 i.

In the shown embodiment, a KrF excimer laser beam having a wavelength of 248 nm is used in order to expose the resist film 131. Accordingly, the silicon nitride film is formed in the following condition in order to set the reflection index of the laser beam at the interface between the resist film 131 and the silicon nitride film 121 within a range of 10 to 20%. Namely, a mixture gas of monosilane (SiH$_4$) gas and ammonia (NH$_3$) gas having mixture ratio (SiH$_4$/NH$_3$) of 20% is used as deposition gas. Pressure was adjusted at 40 Pa, a deposition temperature was 300° C., and RF (radio frequency) power was 400W.

Subsequently, the resist film 131 is exposed by irradiating KrF excimer laser beam (incident light 141) on the resist film 131. At this time, a part of the incident light 141 is reflected at the interface 151 between the resist film 131 and the silicon nitride film 121 to be a first reflected light 143a. On the other hand, the remained incident light propagates within the silicon nitride film 121 with attenuation to reach the second interface 152 between the silicon nitride film 121 and the film 111 to be patterned. Most of the incident light reaching the second interface 152 is reflected thereat to be a second reflected light 143b. The reflected light 143a and 143b reflected at the first and second interface 151, 152 propagates through the resist film 131. Accordingly, a standing wave is generated by interference between the incident light 141 and the reflected light 143a and 143b.

Figure 11:
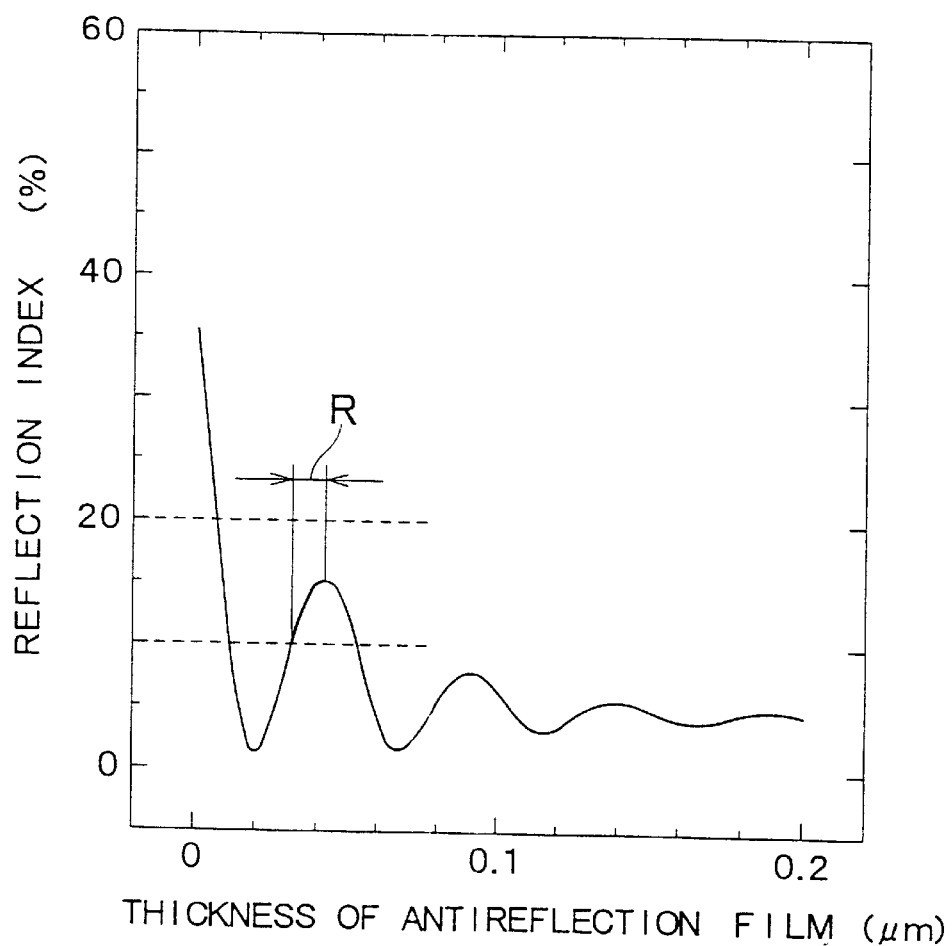
FIG. 11 is a graph showing a relationship between a reflection index and a thickness of an antireflection film with taking the reflection index of a laser beam at a first interface in the vertical axis and the thickness of an antireflection film in the horizontal axis.

FIG. 11 is a graph showing a relationship between the reflection index and a thickness of an antireflection film with taking the reflection index of the laser beam at the first interface 151 in vertical axis and the thickness of the antireflection film in the horizontal axis. The reflection index of the laser beam at the interface 151 between the resist film 131 and the silicon nitride film 121 depends on the thickness of the antireflection film (silicon nitride film 121). Namely, according to increasing of the thickness of the silicon nitride film 121, the reflection index converges to a given value with repeating extreme maximum and extreme minimum. For obtaining the reflection index in a range of 10 to 20% and for locating the extreme maximum of the pair across the first interface in the resist film, it is preferred to set the thickness of the silicon nitride film 121 within a range of 0.03 to 0.04 $\mu$m. It should be noted that, in FIG. 11, the range where the condition defined in the present invention is satisfied is identified by R.

Figure 12:
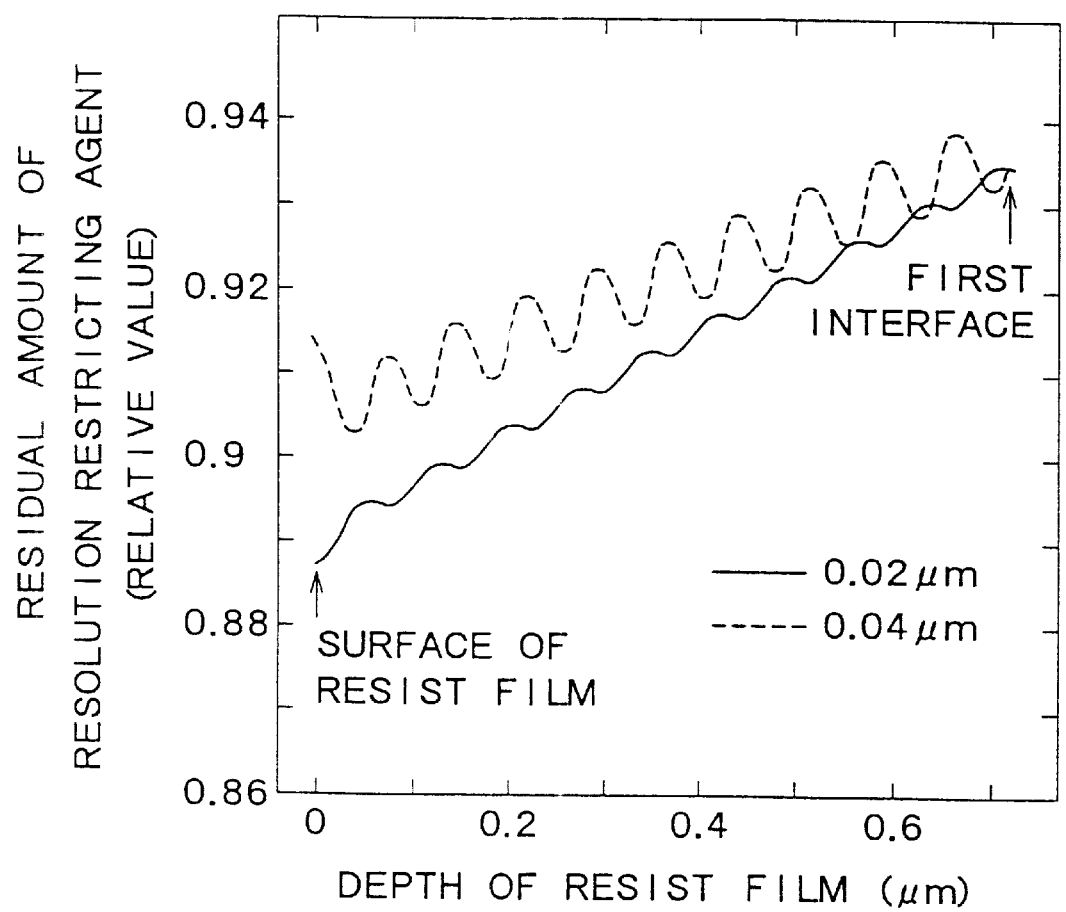
FIG. 12 is a graph showing a residual amount of a resolution restricting agent in the resist film with taking the residual amount of the resolution restriction agent in vertical axis and a depth of the resist film in the horizontal axis.

After exposure of the resist film 131, PEB is performed for the resist film 131. Discussion will be given with respect to a residual amount of a resolution restricting agent in the resist film 131 after PEB. FIG. 12 is a graph showing a residual amount of the resolution restricting agent in the resist film with taking the residual amount of the resolution restriction agent in vertical axis and a depth of the resist film in the horizontal axis. It should be noted that the depth of the resist film means a distance in the depth direction from the surface when the surface of the resist film is 0 $\mu$m. Also, the residual amount of the resolution restricting agent is expressed by a relative value with taking a value when the residual value of the resolution restricting agent when acid catalytic reaction is not caused at all, as 1. Namely, the greater value of the residual amount of the resolution restricting agent represents greater difficulty of development.

As shown in FIG. 11, the thickness of the silicon nitride film 121 is preferably 0.02 $\mu$m, when the reflection index of the laser beam at the first interface 151 becomes extreme minimum. On the other hand, when the reflection index of the laser beam at the first interface 151 becomes the extreme maximum, the preferred thickness of the silicon nitride film 121 is 0.04 $\mu$m. Accordingly, in FIG. 12, there are illustrated the cases where two mutually different thickness of silicon nitride films 121 are formed. In FIG. 12, the residual amount of the resolution restricting agent, when the silicon nitride film is formed in thickness of 0.02 $\mu$m, is illustrated by the solid line, and the residual amount of the resolution restriction agent, when the silicon nitride film is formed in thickness of 0.04 $\mu$m, is illustrated by the broken line.

As shown in FIG. 12, in either thickness, the light intensity of the standing wave is high and the residual amount of the resolution restricting agent is small at the surface of the resist film 131 (position there the depth is 0.0 $\mu$m). On the other hand, when the silicon nitride film in the thickness of 0.02 $\mu$m is formed, the light intensity at the first interface 151 becomes extreme minimum. Therefore, the residual amount of the resolution restricting agent in the resist film in the vicinity of the first interface 151 becomes high. On the other hand, when the silicon nitride film in the thickness of 0.04 $\mu$m is formed, the light intensity at the first interface 151 becomes extreme maximum. Therefore, the residual amount of the resolution restricting agent in the resist film in the vicinity of the first interface 151 becomes low.

Accordingly, when the resist film is formed on the surface of the silicon nitride film in the thickness of 0,02 $\mu$m and is patterned, the obtained patterned resist film will have non-uniformly spread baseboard portion. Namely, the shape of the baseboard portion of the patterned resist film on the first interface 151 cannot be straight. On the other hand, when the resist film is formed on the silicon nitride film in the thickness of 0.03 to 0.04 µm and is patterned, the side surface of the obtained patterned resist film extends substantially vertical relative to the substrate, and the shape of the baseboard of the patterned resist film on the interface 151 becomes straight.

Figure 13A:
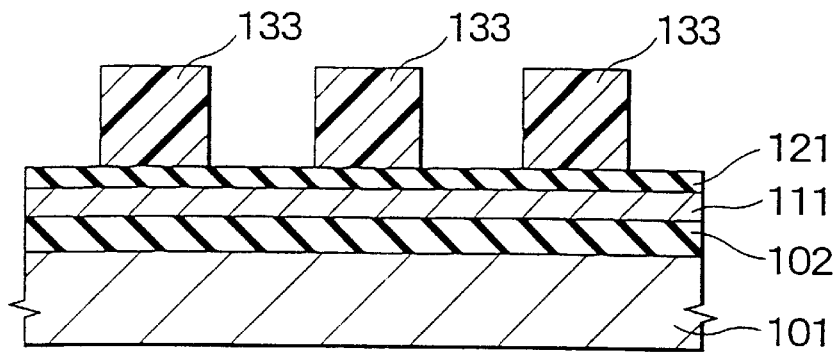
FIGS. 13A to 13C are sections showing sequential process steps next to a patterning process shown in FIG. 10.
Figure 13B:
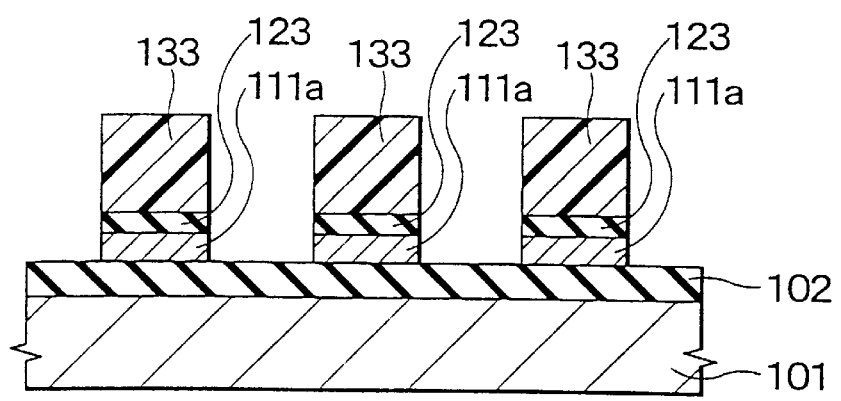
Figure 13C:
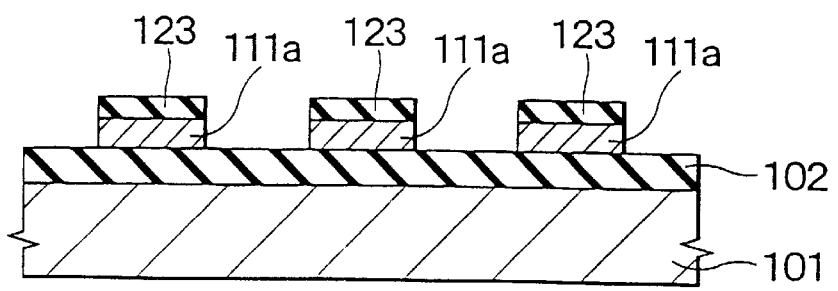

FIGS. 13A to 13C are sections showing sequential process steps next to the patterning process shown in FIG. 10. As shown in FIG. 13A, the patterned resist film 133 is formed by developing the resist film after PEB. Next, as shown in FIG. 13B, the silicon nitride film 121 is patterned by parallel plate type or magnetron dry etching apparatus with taking the patterned resist film 133 as a mask for etching, to form a patterned silicon nitride film 123. It should be noted that, in the shown embodiment, a mixture gas of sulfur hexafluoride ($SF_6$) gas and chlorine ($Cl_2$) gas is used as patterning condition of the silicon nitride film, pressure is 27 Pa and RF power is 800W.

Next, the film 111 is patterned by the dry etching apparatus, to form wiring 111a of tungsten silicide. In the shown embodiment, a mixture gas of trifluoro methane ($CHF_3$) gas, Ace tetrafluoro methane ($CF_4$) gas and argon (Ar) gas is used as patterning condition of the film to be patterned, pressure is 67 Pa and RF power is 800 W.

Subsequently, as shown in FIG. 13C, the patterned resist film 133 is removed from the substrate 101 by ashing employing oxygen ($O_2$) plasma. Thereafter, the upper surface of the insulation layer 102 is formed of the silicon oxide, the patterned silicon nitride film 123 is selectively removed by wet etching using hot phosphoric acid whose temperature is greater than or equal to 100° C., for example, as required.

Figure 14:
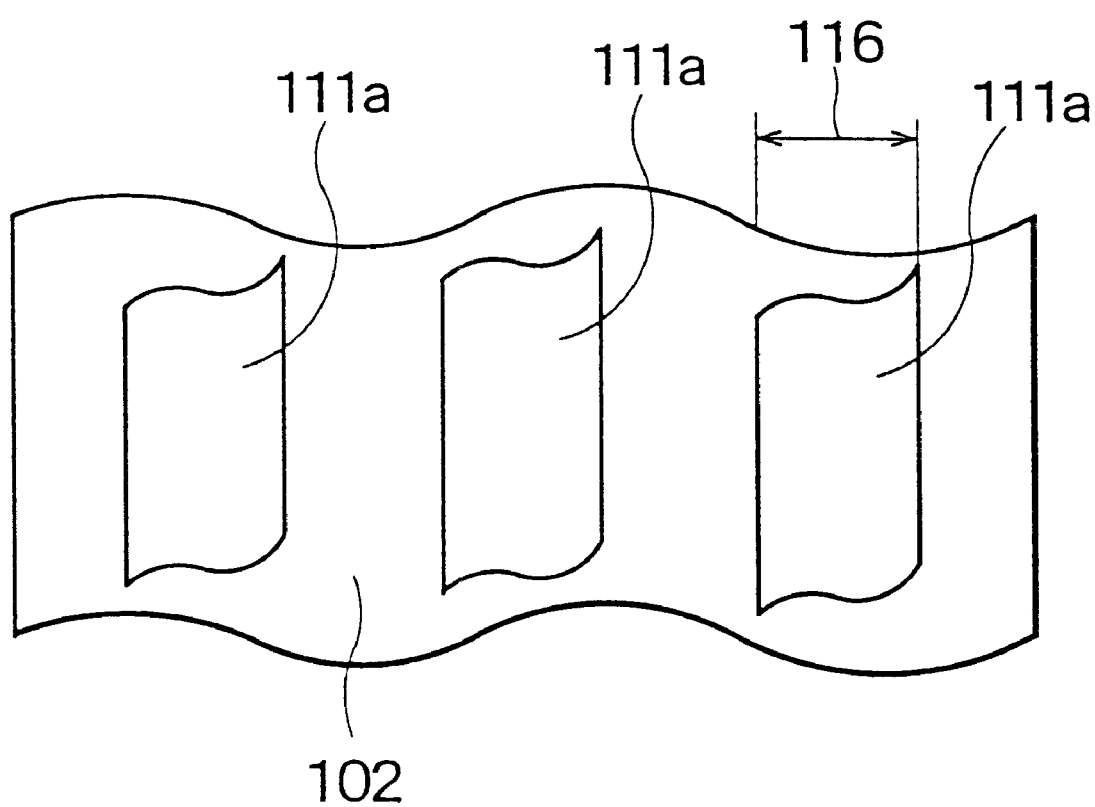
FIG. 14 is a plan view showing a shape of wiring patterned using a patterned resist film.

FIG. 14 is a plan view showing the shape of wiring patterned using the patterned resist film. When the resist film is patterned by the patterning method according to the shown embodiment to form the wiring 111a using obtained patterned resist film, the width 116 of the wiring 111a may not cause fluctuation of dimension in comparison with the width of the wiring formed through the prior art. By this, the wiring 111a having high precision is formed. Accordingly, degradation of the semiconductor characteristics which should be caused by non-uniformity of the wiring width, can be successfully restricted.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

For example, while discussion for the shown embodiment has been given for patterning of the tungsten silicide film as the film to be patterned with employing the silicon nitride film as the antireflection film formed by PECVD, the positive type resist film as the chemical amplification type resist film for the far ultraviolet radiation, and KrF eximer laser as a light source for lithography, the present invention should not be limited to the elements set forth above. For instance, silicon oxide nitride film, silicon carbonate film, hydrogen added amorphous carbon (amorphous-C:H) or organic film may be used as the antireflection film. Also, the present invention is applicable for the negative chemical amplification type resist film for the far ultraviolet radiation. Furthermore, ArF eximer laser having wavelength of 193 nm, i ray or g ray may be used as the light source for lithography.

In addition, in the shown embodiment, after forming the insulation layer 102 on the surface of the silicon substrate 101, the film 111 to be patterned is formed on the insulation layer 102. However, in the present invention, the semiconductor substrate is not limited to the silicon substrate, the substrate can be a compound semiconductor substrate, for example. Also, the film to be patterned may be directly mounted on the surface of the substrate.

What is claimed is:

1. A patterning method of a chemical amplification resist film for a far ultraviolet radiation comprising the steps of:
   forming an antireflection film on a film to be patterned which is formed on a semiconductor substrate;
   forming a chemical amplification resist film for far ultraviolet radiation on said antireflection film, a first interface being formed between said antireflection film and said resist film, and a second interface being formed between said antireflection film and said film to be patterned; and
   selectively irradiating a light for lithography to said resist film, in which
   said light radiates on said resist film as an incident light and is reflected at said first interface to be a first reflected light, which has a light intensity in a range of 10 to 20% of the light intensity of said incident light, and is reflected at said second interface to be a second reflected light, wherein said first and second reflected light are combined to form a composite reflected light to cause interference with said incident light to form a standing wave, whose light intensity has a maximum and a minimum appearing alternatively, a pair of minimum and maximum being across said first interface, said antireflection film adjacent to said resist film and said minimum of said pair being located in said antireflection film and said maximum of said pair being located in said resist film.

2. A patterning method of a chemical amplification resist film for far ultraviolet radiation as set forth in claim 1, wherein the light intensity of said first reflected light and the light intensity of said standing wave are set by adjusting a thickness of said antireflection film.

3. A patterning method of a chemical amplification resist film for a far ultraviolet radiation comprising the steps of:
   forming an antireflection film on a film to be patterned which is formed on a semiconductor substrate;
   forming a chemical amplification resist film for far ultraviolet radiation on said antireflection film, a first interface being formed between said antireflection film and said resist film, and a second interface being formed between said antireflection film and said film to be patterned; and
   selectively irradiating a light for lithography to said resist film, in which said light radiates on said resist film as an incident light and is reflected at said first interface to be a fist reflected light, which has a light intensity in a range of 10 to 20% of the light intensity of said incident light, and is reflected at said second interface to be a second reflected light, wherein said first and second reflected light are combined to form a composite reflected light to cause interference with said incident light to form a standing wave, whose light intensity has a maximum and a minimum appearing alternatively, a pair of minimum and maximum being across said first interface, said antireflection film adjacent to said resist film and said minimum of said pair being located in said antireflection film and said maximum of said pair being located in said resist film, wherein said antireflection film is a film selected from a group consisting of silicon nitride film, silicon nitride oxide film, silicon carbide film, hydrogen added amorphous carbon film and organic film.

4. A patterning method of a chemical amplification resist film for far ultraviolet radiation as set forth in claim 1, wherein an insulation film is formed between said semiconductor substrate and said film to be patterned.

5. A patterning method of a chemical amplification resist film for far ultraviolet radiation as set forth in claim 1, wherein said film to be patterned is a film selected among a group consisted of polycrystalline silicon film, silicide film and metal film.

6. A patterning method of a chemical amplification resist film for far ultraviolet radiation as set forth in claim 1, wherein the light for lithography is a light selected among a group consisted of KrF excimer laser beam, ArF excimer laser beam, g ray and i ray.

7. A patterning method of a chemical amplification resist film for far ultraviolet radiation as set forth in claim 1, which further comprises the steps of:

performing post-exposure-bake for said resist film after said step of irradiating the light for lithography to said resist film; and developing baked resist film.

8. A patterning method of a chemical amplification type resist film for far ultraviolet radiation as set forth in claim 1, wherein said semiconductor substrate is a silicon substrate.

9. A patterning method of a chemical amplification resist film for far ultraviolet radiation as set forth in claim 1, wherein said semiconductor substrate is a compound semiconductor substrate.

10. A patterning method of a chemical amplification resist film for a far ultraviolet radiation comprising the steps of:

forming an antireflection film on a film to be patterned which is formed on a semiconductor substrate;

forming a chemical amplification resist film for far ultraviolet radiation on said antireflection film, a first interface being formed between said antireflection film and said resist film, and a second interface being formed between said antireflection film and said film to be patterned; and selectively irradiating a light for lithography to said resist film, in which said light radiates on said resist film as an incident light and is reflected at said first interface to be a first reflected light, which has a light intensity in a range of 10% to 20% of the light intensity of said incident light, and is reflected at said second interface to be a second reflected light, wherein said first and second reflected light are combined to form a composite reflected light to cause interference with said incident light to form a standing wave, whose light intensity has a maximum and a minimum appearing alternatively, a pair of minimum and maximum being across said first interface, said antireflection film adjacent to said resist film and said minimum of said pair being located in said antireflection film and said maximum of said pair being located in said resist film, wherein said antireflection film is silicon nitride film having a thickness in a range of 0.03 to 0.04 μm.

11. A patterning method of a chemical amplification resist film for far ultraviolet radiation as set forth in claim 10, wherein said step of forming said antireflection film is a step of forming silicon nitride film using a mixture gas of monosilane gas and ammonia gas, in which monosilane gas forms a 20% volume ratio with said ammonia gas, at a pressure of 40 Pa, temperature of 300° C., at 400W of radio frequency power.

12. A method for forming a resist film pattern for forming an etching mask for etching a film to be patterned provided on a surface of a semiconductor substrate, said etching mask being formed of resist film pattern consisting of a far ultraviolet chemical amplification resist film, comprising the steps of:

forming an antireflection film for covering a surface of said film to be patterned and applying said ultraviolet chemical amplifier resist film onto said antireflection film for exposure, wherein reflectance at a first interface comprising said far ultraviolet chemical amplification resist film and said antireflection film with respect to incident light at the time of exposure is 10% to 20%, and thickness of said antireflection film is set such that the light strength of a standing wave generated by interference between said incident light and reflection light from said first interface and a second interface comprising said antireflection film and said film to be patterned is within a range varying from the minimum to the maximum toward an upper portion of said far ultraviolet chemical amplifier resist film from said first interface.

13. The method for forming a resist film pattern for forming an etching mask for etching a film to be patterned provided on a surface of a semiconductor substrate, said etching mask being formed of resist film pattern consisting of a far ultraviolet chemical amplification resist film, comprising the steps of:

forming an antireflection film for covering a surface of said film to be patterned and applying said ultraviolet chemical amplifier resist film onto said antireflection film for exposure, wherein reflectance at a first interface comprising said far ultraviolet chemical amplifier resist film and said antireflection film with resect to incident light at the time of exposure is 10% to 20%, and thickness of said antireflection film is set such that the light strength of a standing wave generated by interference between said incident light and reflection light from said first interface and a second interface comprising said antireflection film and said film to be patterned is within a range varying from the minimum to the maximum toward an upper portion of said far ultraviolet chemical amplification resist film from said first interface, wherein said antireflection film is only a silicon nitride film.

14. The method for forming a resist film pattern in claim 13, wherein said resist film is irradiated by a KF excimer laser beam.

15. The method for forming a resist film pattern in claim 14, wherein said film to be patterned is a tungsten silicide film.

16. The method for forming a resist film pattern in claim 15, wherein said silicon nitride film has a thickness of 30 nm to 40 nm.

17. The method for forming a resist film pattern in claim 16, wherein said silicon nitride film is formed by a gas including monosilane gas and ammonia gas.

* * * * *